(12) United States Patent
Kalutarage et al.

(10) Patent No.: US 10,985,009 B2
(45) Date of Patent: Apr. 20, 2021

(54) METHODS TO DEPOSIT FLOWABLE (GAP-FILL) CARBON CONTAINING FILMS USING VARIOUS PLASMA SOURCES

(71) Applicant: Applied Materials, Inc., Santa Clara, CA (US)

(72) Inventors: Lakmal Charidu Kalutarage, San Jose, CA (US); Mark Saly, Milpitas, CA (US); David Thompson, San Jose, CA (US); William John Durand, San Francisco, CA (US); Kelvin Chan, San Ramon, CA (US); Hanhong Chen, Milpitas, CA (US); Philip Allan Kraus, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/374,345

(22) Filed: Apr. 3, 2019

(65) Prior Publication Data
US 2019/0333760 A1  Oct. 31, 2019

Related U.S. Application Data

(60) Provisional application No. 62/663,846, filed on Apr. 27, 2018.

(51) Int. Cl.
| | | |
|---|---|---|
| *H01L 21/02* | (2006.01) | |
| *C23C 16/513* | (2006.01) | |
| *C23C 16/26* | (2006.01) | |

(52) U.S. Cl.
CPC ........ *H01L 21/02118* (2013.01); *C23C 16/26* (2013.01); *C23C 16/513* (2013.01);
(Continued)

(58) Field of Classification Search
CPC .......... H01L 21/0028; H01L 21/02115; H01L 21/02118; H01L 21/02205;
(Continued)

(56) References Cited

U.S. PATENT DOCUMENTS 5,759,635 A    6/1998  Logan
9,514,932 B2 * 12/2016  Mallick ............... H01L 21/0226
(Continued)

FOREIGN PATENT DOCUMENTS

JP      01094626 A     4/1989
JP      04357877 A    12/1992
JP     2004064023 A    2/2004

OTHER PUBLICATIONS

International Search Report and Written Opinion from PCT/US2019/025828 dated Jul. 23, 2019, 9 pgs.
(Continued)

*Primary Examiner* — Ermias T Woldegeorgis
(74) *Attorney, Agent, or Firm* — Schwabe, Williamson & Wyatt, P.C.

(57) ABSTRACT

Embodiments include a method for forming a carbon containing film. In an embodiment, the method comprises flowing a precursor gas into a processing chamber. For example the precursor gas comprises carbon containing molecules. In an embodiment, the method further comprises flowing a co-reactant gas into the processing chamber. In an embodiment, the method further comprises striking a plasma in the processing chamber. In an embodiment plasma activated co-reactant molecules initiate polymerization of the carbon containing molecules in the precursor gas. Embodiments may also include a method that further comprises depositing a carbon containing film onto a substrate in the processing chamber.

20 Claims, 7 Drawing Sheets

(52) U.S. Cl.
CPC .... *H01L 21/0228* (2013.01); *H01L 21/02126* (2013.01); *H01L 21/02205* (2013.01); *H01L 21/02274* (2013.01); *H01L 21/02348* (2013.01)

(58) Field of Classification Search
CPC ......... H01L 21/02274; H01L 21/76224; H01L 21/76229; H01L 21/02126
See application file for complete search history.

(56) References Cited

U.S. PATENT DOCUMENTS

| | | |
|---|---|---|
| 2006/0084280 A1 | 4/2006 | Matsuki et al. |
| 2008/0003824 A1 | 1/2008 | Padhi et al. |
| 2010/0104770 A1* | 4/2010 | Goundar ........... H01J 37/32091 427/569 |
| 2013/0217241 A1* | 8/2013 | Underwood ...... H01L 21/02216 438/778 |
| 2014/0363983 A1 | 12/2014 | Nakano et al. |
| 2017/0158809 A1 | 6/2017 | Gleason et al. |

OTHER PUBLICATIONS

International Preliminary Report on Patentability from PCT/US2019/025828 dated Nov. 5, 2020, 7 pgs.

* cited by examiner

METHODS TO DEPOSIT FLOWABLE (GAP-FILL) CARBON CONTAINING FILMS USING VARIOUS PLASMA SOURCES

CROSS-REFERENCE TO RELATED APPLICATIONS

This application claims the benefit of U.S. Provisional Application No. 62/663,846, filed on Apr. 27, 2018, the entire contents of which are hereby incorporated by reference herein.

BACKGROUND

1) Field

Embodiments relate to the field of semiconductor processing methods to form flowable carbon containing films, and in a particular embodiment, a flowable chemical vapor deposition (F-CVD) process for forming flowable carbon containing films with radical induced polymerization.

2) Description of Related Art

Semiconductor device geometries have drastically decreased in size since their introduction several decades ago. Modern semiconductor fabrication equipment routinely produce devices with 45 nm, 32 nm, 28 nm and smaller feature sizes. The decreasing feature sizes result in structural features on the device having decreased width. The widths of gaps and trenches on the device narrow such that filling the gap with dielectric materials becomes more challenging.

In the particular instance of carbon containing films, a spin-on process is often used. In such processes, a carbon containing liquid is dispensed onto the surface of a substrate. The substrate is then spun in order to evenly distribute the liquid over the surface. However, such processes have several disadvantages. One disadvantage is that there is a lot of waste since much of the carbon containing liquid is spun off of the spinning substrate surface during processing.

Figure 1:
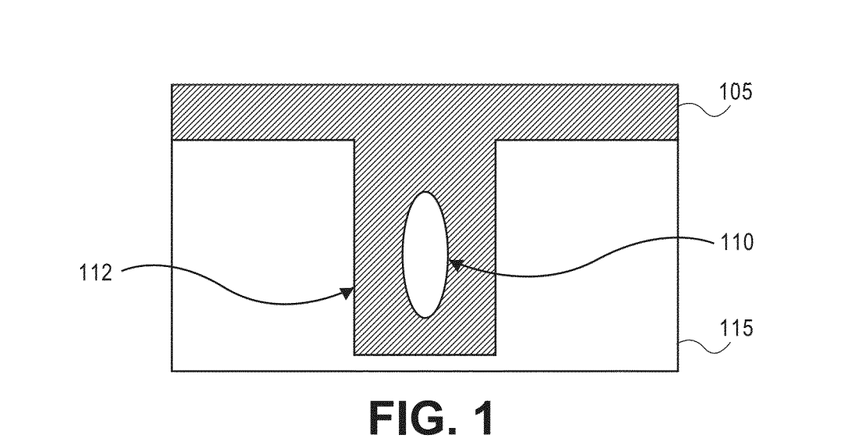
FIG. 1 is a cross-sectional illustration of a carbon film that has a void in a high aspect ratio trench.

Additionally, spin-on processes often leave voids when used to fill high aspect ratio features. A void 110 in a carbon film 105 that partially fills a high aspect ratio trench 112 in a substrate 115 is shown in FIG. 1. Voids may be generated in such films when the solvents of the spun-on liquid are removed during a curing process. For example, the solvent molecules in spin-on processes are typically small molecules. The small molecules vaporize during a post-apply bake (PAB). The vaporization process leads to void formation and shrinkage. Voids may also be formed because the carbon containing liquid is not able to completely fill a gap or trench prior to curing. Furthermore, spun-on carbon films have a relatively high concentration of hydrogen.

Additionally, it is also noted that vacuum processes for depositing carbon films (e.g., chemical vapor deposition (CVD) or atomic layer deposition (ALD)) also do not adequately fill high aspect ratio features. For example, the growing film will be pinched off at the neck leaving a void. Accordingly, there is not currently a suitable process for providing voidless filling of high aspect ratio features with a carbon film.

SUMMARY

Embodiments include a method for forming a carbon containing film. In an embodiment, the method comprises flowing a precursor gas into a processing chamber. For example the precursor gas comprises carbon containing molecules. In an embodiment, the method further comprises flowing a co-reactant gas into the processing chamber. In an embodiment, the method further comprises striking a plasma in the processing chamber. In an embodiment plasma activated co-reactant molecules initiate polymerization of the carbon containing molecules in the precursor gas. Embodiments may also include a method that further comprises depositing a carbon containing film onto a substrate in the processing chamber.

Embodiments include a method for forming a carbon and nitrogen containing film. In an embodiment, the method comprises flowing a precursor gas into a processing chamber. For example, the precursor gas comprises carbon containing molecules. In an embodiment, the method may further comprise flowing a co-reactant gas into the processing chamber. In an embodiment, one or both of the carbon containing molecules of the precursor gas and the co-reactant gas comprise nitrogen. In an embodiment, the method may further comprise striking a plasma in the processing chamber. In an embodiment plasma activated co-reactant molecules initiate polymerization of carbon containing molecules in the precursor gas. In an embodiment, the method may further comprise depositing a carbon and nitrogen containing film onto a substrate in the processing chamber.

Embodiments may include a method for forming a carbon-nitrogen-oxygen film. In an embodiment, the method may comprise flowing a precursor gas into a processing chamber. For example, the precursor gas comprises carbon containing molecules. In an embodiment, the method may further comprise flowing a co-reactant gas into the processing chamber. In an embodiment, one or both of the carbon containing molecules of the precursor gas and the co-reactant gas comprise nitrogen and oxygen. In an embodiment, the method may further comprise striking a plasma in the processing chamber. In an embodiment, plasma activated co-reactant molecules initiate polymerization of the carbon containing molecules in the precursor gas. In an embodiment, the method may further comprise depositing a carbon-nitrogen-oxygen film onto a substrate in the processing chamber.

The above summary does not include an exhaustive list of all embodiments. It is contemplated that all systems and methods are included that can be practiced from all suitable combinations of the various embodiments summarized above, as well as those disclosed in the Detailed Description below and particularly pointed out in the claims filed with the application. Such combinations have particular advantages not specifically recited in the above summary.

DETAILED DESCRIPTION

Devices in accordance with embodiments described herein include methods of forming a flowable carbon containing film. In a particular embodiment, an F-CVD process is used to form a flowable carbon containing film. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

As noted above, carbon containing films formed with spin-on processes have significant drawbacks. Particularly, the spun-on carbon films often result in poor quality films that exhibit shrinkage and that form voids in high aspect ratio trenches. Accordingly, embodiments described herein include processes for forming carbon containing films with a flowable chemical vapor deposition (F-CVD) process. Particularly, the F-CVD process produces a flowable carbon containing film that has a viscosity that enables the flowable carbon containing film to completely fill high aspect ratio features on a substrate surface.

Figure 2A:
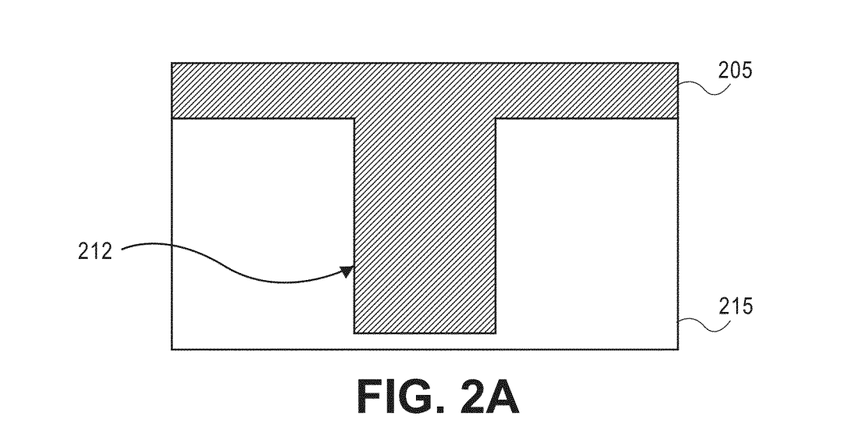
FIG. 2A is a cross-sectional illustration of a carbon containing film that completely fills a high aspect ratio trench, in accordance with an embodiment.

For example, in FIG. 2A, a flowable carbon containing film 205 is formed over a surface of a substrate 215. In an embodiment, the flowable carbon containing film 205 completely fills a high aspect ratio trench 212 formed into the substrate 215. As used herein, a high aspect ratio trench 212 may include an aspect ratio of 10:1 or greater. In an embodiment, a high aspect ratio trench 212 may include an aspect ratio of 50:1 or greater. In an embodiment, a high aspect ratio trench 212 may include an aspect ratio of 100:1 or greater.

Figure 2B:
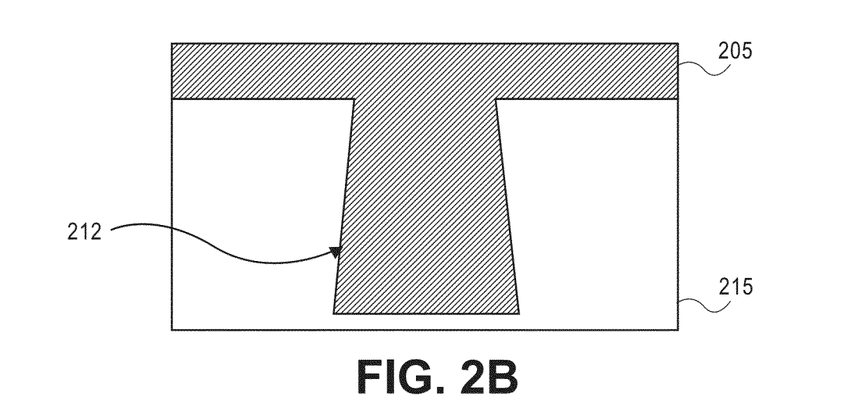
FIG. 2B is a cross-sectional illustration of a carbon containing film that completely fills a high aspect ratio trench with a reentrant profile, in accordance with an embodiment.

Additional embodiments may include an F-CVD process that is capable of completely filling a trench with any profile. For example, in FIG. 2B a cross-sectional illustration of a high aspect ratio trench 212 with a reentrant profile in a substrate 215 is shown, in accordance with an embodiment. In an embodiment, the flowable carbon containing film 205 may allow for complete filling of a trench with a reentrant profile.

Figure 2C:
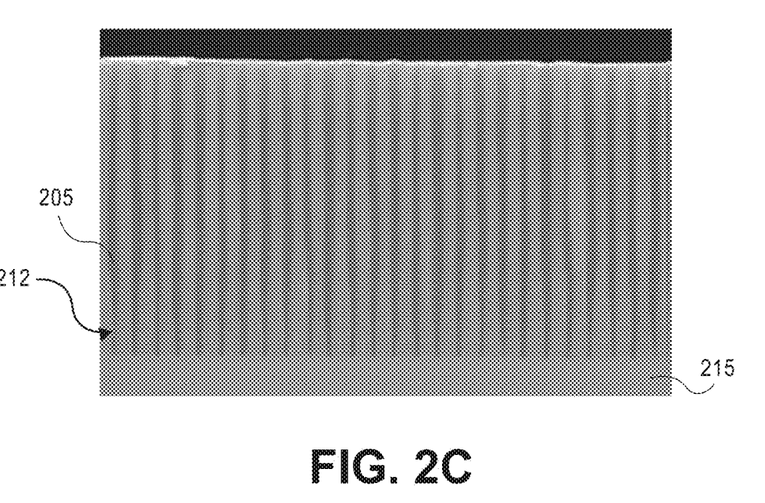
FIG. 2C is a cross-sectional micrograph of high aspect ratio trenches that are filled with a carbon containing film, in accordance with an embodiment.
Figure 2D:
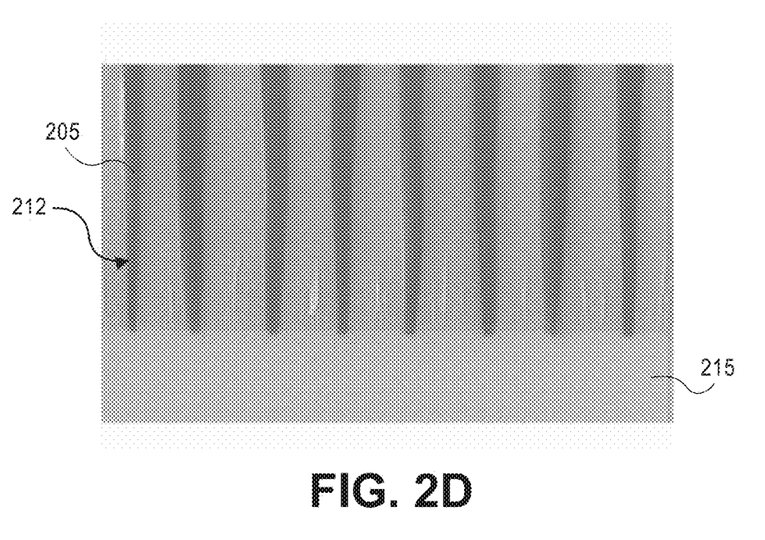
FIG. 2D is a zoomed in cross-sectional micrograph that illustrates the bottom of the high aspect ratio trenches that show complete filling of the trenches with the carbon containing film, in accordance with an embodiment.

Referring now to FIG. 2C, a cross-sectional micrograph of high aspect ratio trenches 212 that are filled with a F-CVD carbon film is shown. In FIG. 2C a plurality of high aspect ratio trenches 212 are formed into a substrate 215. For example, the high aspect ratio trenches may have an aspect ratio of 20:1 or greater, 50:1 or greater, or 100:1 or greater. As shown, the profile of the trenches may not necessarily be perfectly vertical. Despite the non-uniform profiles across all of the trenches 212, the carbon containing film 205 still provides complete filling of the trenches 212. Referring now to FIG. 2D, a zoomed in portion of the micrograph in FIG. 2C is shown, in accordance with an embodiment. The bottom portions of the trenches 212 are shown in FIG. 2D. As shown, even at the bottom of the trenches 212, there is complete filling by the carbon containing film 205.

In addition to being able to completely fill high aspect ratio features, carbon containing films formed with F-CVD processes described herein allow for other improvements compared to films formed with spin-on processes. One advantage is that carbon containing films formed with F-CVD processes include a lower hydrogen concentration. In some embodiments, a low temperature F-CVD process (e.g., approximately 75° C.) may result in a carbon containing film that has a hydrogen concentration between approximately 30% and 45%. This low hydrogen concentration is comparable to a spun-on carbon film that is formed at much higher temperatures (e.g., 300° C. or greater). Additionally, carbon containing films formed with F-CVD processes also show good ash resistance compared to traditional CVD carbon films. For example, it has been shown that ash resistance of carbon containing films formed with F-CVD processes exhibit ashing resistance that is between 10% and 30% better than the ash resistance of traditional spin-on carbon films. Additionally, it has been shown that dry etch resistivity of carbon containing films formed with F-CVD processes exhibit dry etch resistivity that is between 1.5 to 4 times the dry etch resistivity of spun-on carbon films. Accordingly, carbon containing films formed with F-CVD processes provide excellent masking layers for semiconductor manufacturing. Furthermore, F-CVD processes disclosed herein eliminate the liquid waste produced with spin-on processes.

Embodiments described herein allow for flowable carbon containing films to be formed on a substrate. It is to be appreciated that embodiments may include carbon containing films that also are carbon-nitrogen ($C_XN_Y$) films and carbon-nitrogen-oxygen ($C_XN_YO_Z$) films. The specific film that is deposited may be determined by the precursor gasses and co-reactant gasses that are used in the F-CVD process, as will be described in greater detail below.

Figure 3:
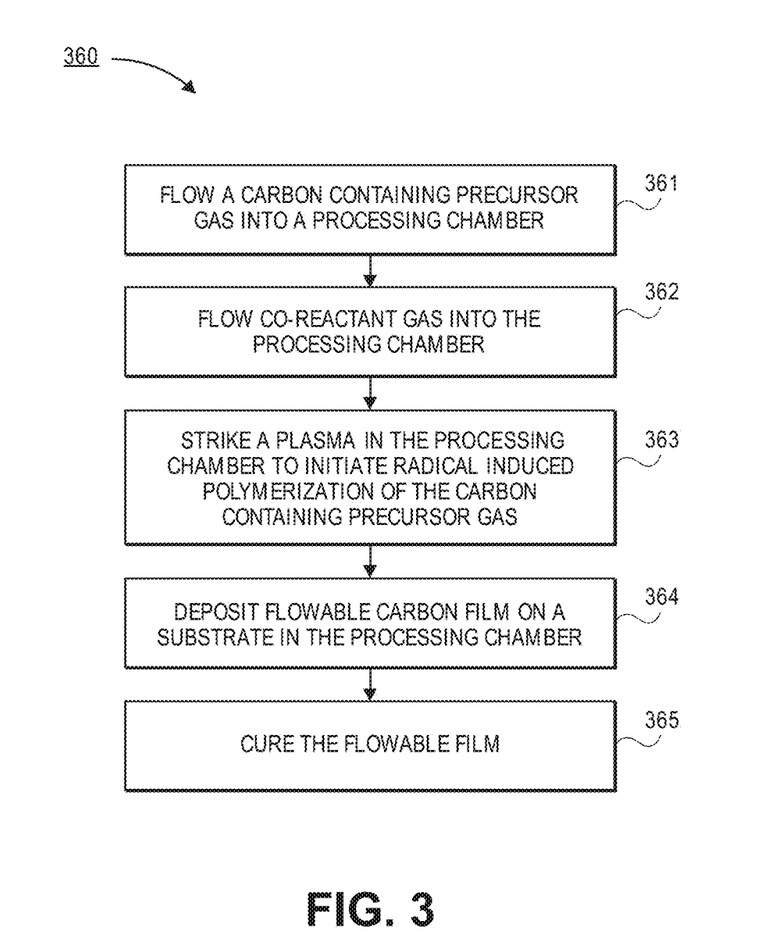
FIG. 3 is a process flow diagram of a process for forming a flowable carbon containing film, in accordance with an embodiment.
Figure 4A:
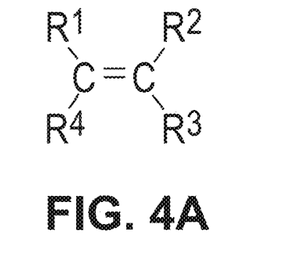
FIG. 4A is chemical formula of a carbon containing precursor that may be used to form a flowable carbon film, in accordance with an embodiment.
Figure 4B:
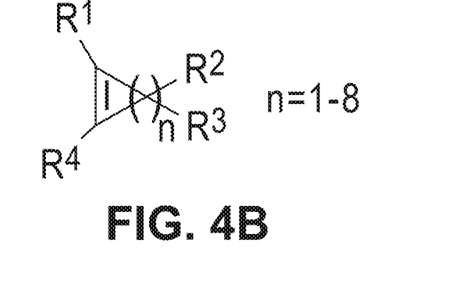
FIG. 4B is a chemical formula of a carbon containing precursor that may be used to form a flowable carbon film, in accordance with an embodiment.
Figure 4C:
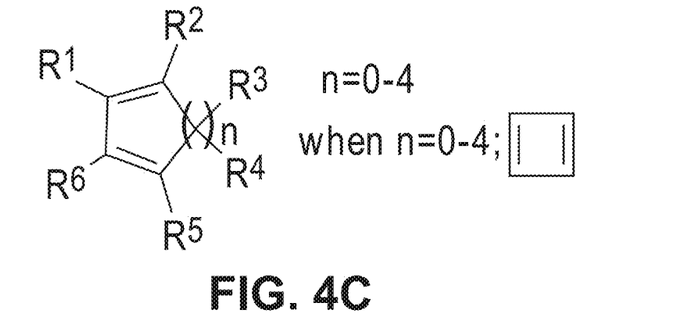
FIG. 4C is a chemical formula of a carbon containing precursor that may be used to form a flowable carbon film, in accordance with an embodiment.
Figure 4D:
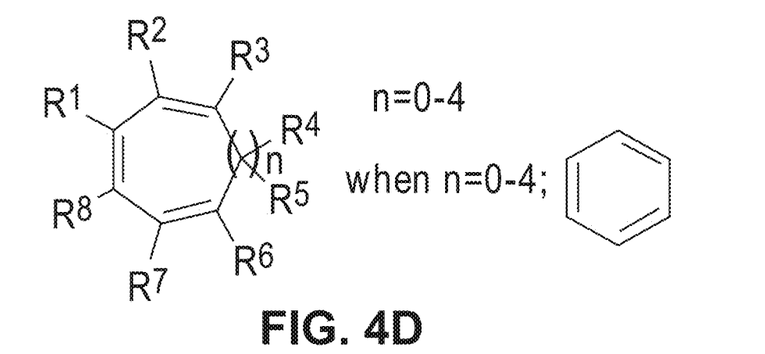
FIG. 4D is a chemical formula of a carbon containing precursor that may be used to form a flowable carbon film, in accordance with an embodiment.
Figure 4E:
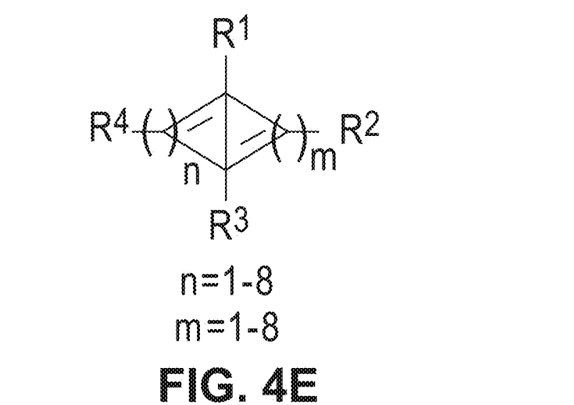
FIG. 4E is a chemical formula of a carbon containing precursor that may be used to form a flowable carbon film, in accordance with an embodiment.

Referring now to FIG. 3, a flow diagram of an F-CVD process 360 used to deposit a flowable carbon containing film is shown, in accordance with an embodiment. In an embodiment, F-CVD process 360 may comprise operation 361 that includes flowing a carbon containing precursor gas into a processing chamber. In an embodiment, the processing chamber may include any suitable chamber for implementing a plasma enhanced CVD (PECVD) process. For example, the processing chamber may include a capacitively coupled plasma (CCP) source, a remote plasma source (RPS), a microwave plasma source, an inductively coupled plasma (ICP) source, or any other plasma source.

In an embodiment, the carbon containing precursor includes molecules that include a vinyl group (C=C). As will be described in greater detail below, the vinyl group is the site where radical induced polymerization is implemented using vinyl functionality to form carbon containing polymers. In an embodiment, the carbon containing precursor may include one or more of the molecules shown in FIGS. 4A-4E.

It is to be appreciated that the molecules illustrated in FIGS. 4A-4E are exemplary in nature, and embodiments include any molecule containing a vinyl functional group. In an embodiment, the molecules in FIGS. 4A-4E may also comprise at least one nitrogen atom and/or at least one oxygen atom.

In an additional embodiment, the carbon containing precursor gas includes molecules that include an alkyne group (C≡C). In an embodiment, the alkyne group is the site where radical induced polymerization is implemented using alkyne functionality to form carbon containing polymers. In an additional embodiment, the carbon containing precursor gas includes molecules that include a nitrile group (C≡N). In an embodiment, the nitrile group is the site where radical induced polymerization is implemented using nitrile functionality to form carbon containing polymers.

In an embodiment, carbon containing precursor gasses such as the molecules shown in FIGS. 4A-4E may comprises R groups that stabilize radicals. For example, R groups may include electron donating groups such as amines, amides, esters, ethers, and conjugated or non-conjugated double and triple bonds. Such R groups may be added to tune the reactivity of the radical induced polymerization described in greater detail below.

In an embodiment, the R groups of the carbon containing precursor gas may comprise one or more alkanes with the formula $C_nH_{2n+1}$ (n=0-8). In an embodiment, the alkanes that form the R groups may be linear and/or branched. For example, linear alkanes may comprise $CH_3$, $C_2H_5$, $C_3H_7$. For example, branched alkanes may comprises isopropyl, n-butyl, sec-butyl, tert-butyl, when n=0, all R groups are hydrogen.

Figure 5A:
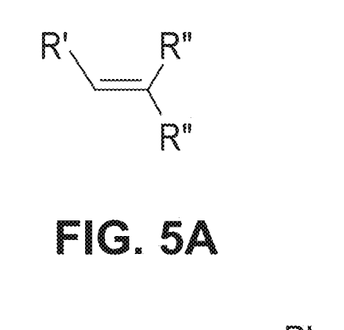
FIG. 5A is a chemical formula of an R group that may be part of the carbon containing precursor, in accordance with an embodiment.
Figure 5B:
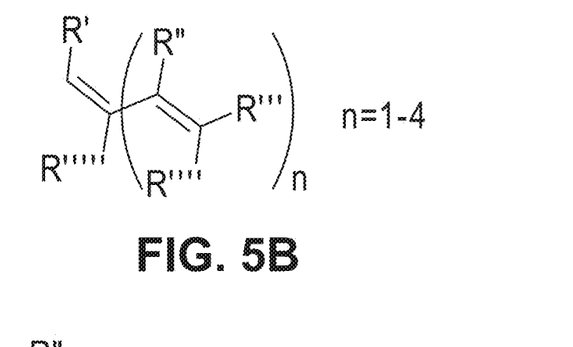
FIG. 5B is a chemical formula of an R group that may be part of the carbon containing precursor, in accordance with an embodiment.
Figure 5C:
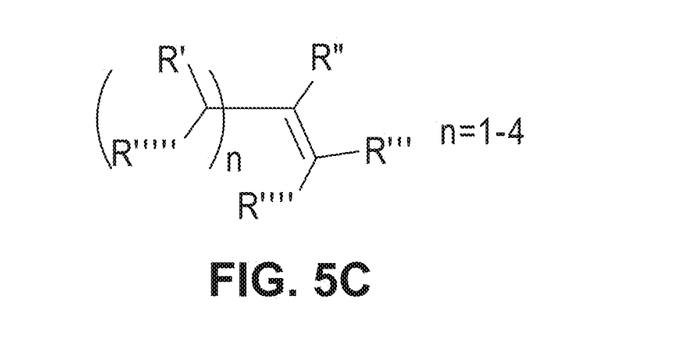
FIG. 5C is a chemical formula of an R group that may be part of the carbon containing precursor, in accordance with an embodiment.

In an embodiment, the R groups of the carbon containing precursor gas may comprise one or more of the chemical formulae shown in FIGS. 5A-5C. In an embodiment, the R groups of the chemical formulae illustrated in FIGS. 5A-5C may comprise alkanes with the formula $C_nH_{2n+1}$ (n=0-8). In an embodiment, the alkanes that form the R groups may be linear and/or branched. For example, linear alkanes may comprise $CH_3$, $C_2H_5$, $C_3H_7$. For example, branched alkanes may comprises isopropyl, n-butyl, sec-butyl, tert-butyl, when n=0, all R groups are hydrogen.

Figure 6A:
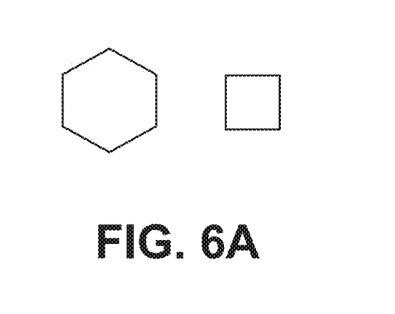
FIG. 6A is a pair of chemical formulas of R groups with the generic formula of $C_nH_{2n-1}$ (n=3-8) that may be part of the carbon containing precursor, in accordance with an embodiment.
Figure 6B:
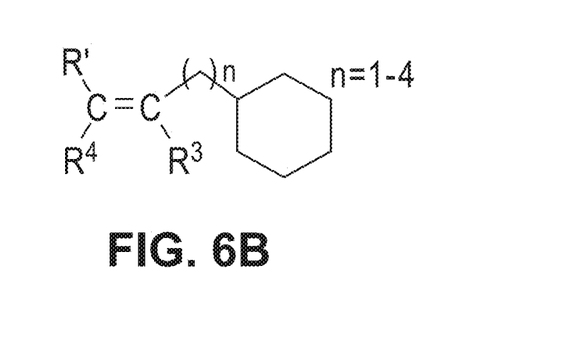
FIG. 6B is a chemical formula of a carbon containing precursor with an R group of FIG. 6A bonded to the carbon containing precursor with a carbon bridge, in accordance with an embodiment.

In an embodiment, the R groups in FIGS. 4A-4E may also comprise cyclic alkanes with the formula $C_nH_{2n-1}$ (n=3-8). An example of two such cyclic alkanes (cyclohexane and cyclobutane) are shown in FIG. 6A. In an embodiment, cyclic alkanes may be bound to the main structure of the molecules illustrated in FIGS. 4A-4E by a carbon bridge. FIG. 6B is an exemplary illustration of such an embodiment, where cyclohexane is bound to a vinyl group of FIG. 4A by a carbon bridge.

Figure 7A:
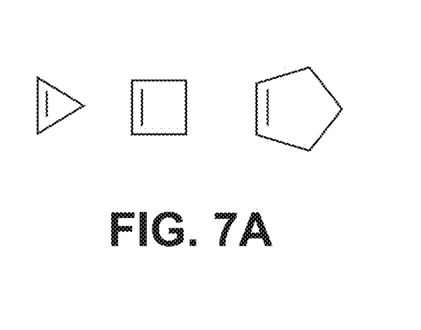
FIG. 7A are examples of chemical formulas of R groups with the generic formula of $C_nH_{2n-3}$ (n=3-8) that may be part of the carbon containing precursor, in accordance with an embodiment.
Figure 7B:
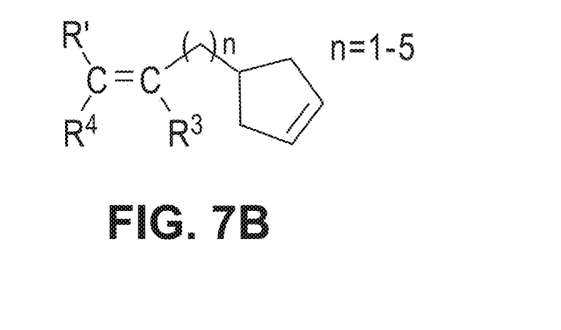
FIG. 7B is a chemical formula of a carbon containing precursor with an R group of FIG. 7A bonded to the carbon containing precursor with a carbon bridge, in accordance with an embodiment.

In an embodiment, the R groups in FIGS. 4A-4E may also comprise cyclic alkenes with the formula $C_nH_{2n-3}$ (n=3-8). An example of three such cyclic alkenes (cyclopropene, cyclobutene, and cyclopentene) are shown in FIG. 7A. In an embodiment cyclic alkenes may be bound to the main structure of the molecules illustrated in FIGS. 4A-4E by a carbon bridge. FIG. 7B is an exemplary illustration of such an embodiment, where cyclohpentene is bound to a vinyl group of FIG. 4A by a carbon bridge.

Figure 8A:
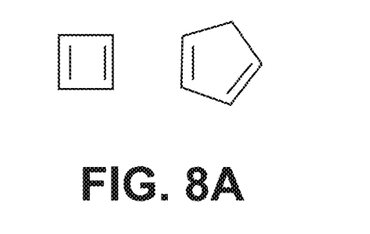
FIG. 8A is a pair of chemical formulas of R groups with the generic formula of $C_nH_{2n-5}$ (n=4-8) that may be part of the carbon containing precursor, in accordance with an embodiment.
Figure 8B:
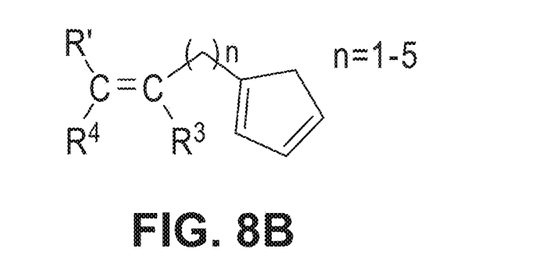
FIG. 8B is a chemical formula of a carbon containing precursor with an R group of FIG. 8A bonded to the carbon containing precursor with a carbon bridge, in accordance with an embodiment.

In an embodiment, the R groups in FIGS. 4A-4E may also comprise cyclic dienes with the formula $C_nH_{2n-5}$ (n=4-8). An example of two such cyclic dienes (cyclobutadiene and cyclopentadiene) are shown in FIG. 8A. In an embodiment cyclic dienes may be bound to the main structure of the molecules illustrated in FIGS. 4A-4E by a carbon bridge. FIG. 8B is an exemplary illustration of such an embodiment, where cyclopentadiene is bound to a vinyl group of FIG. 4A by a carbon bridge.

Figure 9A:
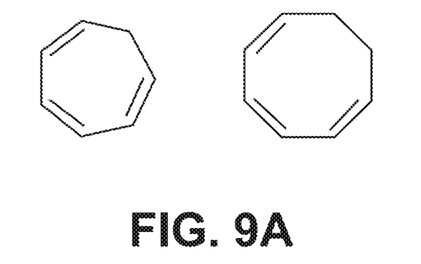
FIG. 9A is a pair of chemical formulas of R groups that may be part of the carbon containing precursor, in accordance with an embodiment.
Figure 9B:
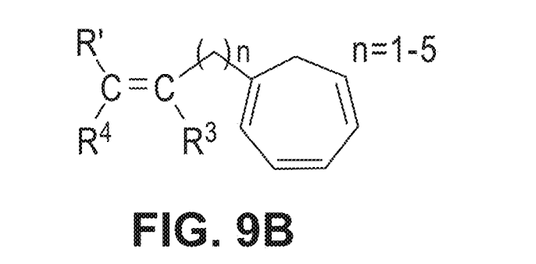
FIG. 9B is a chemical formula of a carbon containing precursor with an R group of FIG. 9A bonded to the carbon containing precursor with a carbon bridge, in accordance with an embodiment.

In an embodiment, the R groups in FIGS. 4A-4E may also comprise cyclic trienes. An example of two such cyclic trienes (cycloheptatriene and cyclooctatriene) are shown in FIG. 9A. In an embodiment cyclic trienes may be bound to the main structure of the molecules illustrated in FIGS. 4A-4E by a carbon bridge. FIG. 9B is an exemplary illustration of such an embodiment, where cycloheptatriene is bound to a vinyl group of FIG. 4A by a carbon bridge.

Figure 10A:
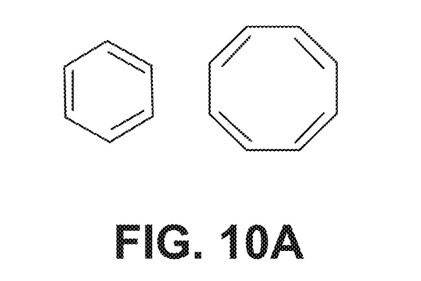
FIG. 10A is a pair of chemical formulas of R groups that may be part of the carbon containing precursor, in accordance with an embodiment.

In an embodiment, the R groups in FIGS. 4A-4E may also comprise benzene and cyclooctatetraene, which are shown in FIG. 10A. In an embodiment such R groups may be bound to the main structure of the molecules illustrated in FIGS.

Figure 10B:
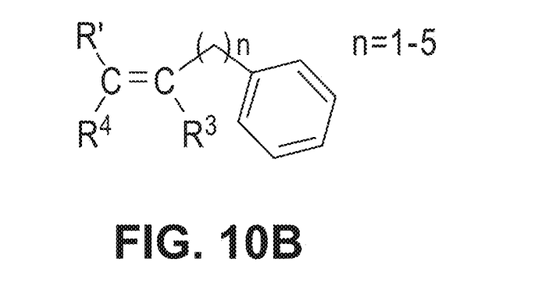
FIG. 10B is a chemical formula of a carbon containing precursor with an R group of FIG. 10A bonded to the carbon containing precursor with a carbon bridge, in accordance with an embodiment.

4A-4E by a carbon bridge. FIG. 10B is an exemplary illustration of such an embodiment where benzene is bound to a vinyl group of FIG. 4A by a carbon bridge.

In an additional embodiment, the carbon containing source gas may include molecules that comprise one or more of a vinyl group, an alkyne group, and a nitrile group. In an embodiment, a single molecule may include one or more of a vinyl group, an alkyne group, and a nitrile group. In an embodiment, the carbon containing source gas may comprise a mixture of gasses, where each of the different gasses include one or more of a vinyl group, an alkyne group, and a nitrile group.

Returning now to F-CVD process 360, the process may comprise operation 362 that includes flowing a co-reactant gas into the processing chamber. In an embodiment, the co-reactant gas may comprise one or more gasses that may be activated by the plasma source. In an embodiment, the co-reactant gas may comprise one or more of Ar, He, $N_2$, $H_2$, and $NH_3$.

In an embodiment, the sequence of carbon containing precursor delivery and co-reactant gas delivery to the chamber may be sequential. For example, pulses of the carbon containing precursor may be delivered to the chamber in an alternating pattern with pulses of the co-reactant gas. In an embodiment, the carbon containing precursor may be delivered to the chamber first, and the co-reactant gas may be delivered to the chamber second. In an embodiment, the co-reactant gas may be delivered to the chamber first, and the carbon containing precursor may be delivered to the chamber second. In an embodiment, the carbon containing precursor gas and the co-reactant gas may be delivered to the chamber simultaneously or partially simultaneously.

F-CVD process 360 may comprises operation 363 that includes striking a plasma in the processing chamber to initiate radical induced polymerization of the carbon containing precursor gas. Plasma activated co-reactant molecules (i.e., radicals and ions) have high energies and react with the carbon containing precursor molecules that are in the gas phase. The radical induced polymerization of the carbon containing precursor gas increases the molecular weight of the carbon containing molecules and results in a phase change to a flowable polymer material. In an embodiment, the plasma the is struck may be a CCP, a ICP, an RSP, or a microwave plasma. In a particular embodiment, a modular micro wave plasma source may be used. That is, a plurality of microwave antennas may be used to couple microwave radiation into the chamber.

In an embodiment, F-CVD process 360 may comprise operation 364 that includes depositing a flowable carbon film on a substrate in the processing chamber. In an embodiment, the flowable polymer material is deposited onto the substrate and is able to flow in order to fill features (e.g., trenches and gaps) on the substrate surface. In an embodiment, the flowable polymer material may fill high aspect ratio trenches. In an embodiment the high aspect ratio trenches may have a reentrant profile. In an embodiment the high aspect ratio trenches may have a an aspect ratio of 10:1 or greater, 50:1 or greater, or 100:1 or greater. In some embodiments, a "flowable carbon containing film" may include a carbon containing film that is able to completely fill a trench or gap with a high aspect ratio. In an embodiment, the F-CVD process 360 may include a substrate temperature that is less than 200° C. In an embodiment, the substrate temperature may be between −10° C. and 200° C.

In an embodiment, F-CVD process 360 may comprise operation 365 that includes curing the flowable carbon film. In an embodiment, the flowable carbon film is cured by increasing the cross-linking of the film. For example, the curing may be UV curing, annealing, or the like.

It is to be appreciated that F-CVD process 360 also comprises flowable carbon containing films that includes other desired elements. For example, F-CVD process 360 may be utilized to form a carbon-nitrogen ($C_XN_Y$) film. In such an embodiment, the co-reactant gas that is flown into the processing chamber at operation 362 may comprise $N_2$ and/or $NH_3$, and one or more of Ar, He, and $H_2$.

In an additional embodiment, a flowable $C_XN_Y$ film may be obtained by utilizing a carbon containing precursor gas such as those described above that comprises nitrogen. In such embodiments, the precursor gas may be reacted with one or more of plasma activated Ar, He, and $H_2$.

It is to be appreciated that F-CVD process 360 also comprises flowable carbon containing films that includes other desired elements. For example, F-CVD process 360 may be utilized to form a carbon-nitrogen-oxygen ($C_XN_YO_Z$) film. In such an embodiment, the co-reactant gas that is flown into the processing chamber at operation 362 may comprise $N_2$ and $O_2$ in combination with one or more of Ar, He, and $H_2$. In an embodiment, the co-reactant gas may comprise $NH_3$ and $O_2$ in combination with one or more of Ar, He, and $H_2$. In an embodiment, the co-reactant gas may comprise $N_2$, $NH_3$, and $O_2$ in combination with one or more of Ar, He, and $H_2$ In an additional embodiment, a flowable $C_XN_YO_Z$ film may be obtained by utilizing a carbon containing precursor gas such as those described above that comprises nitrogen and oxygen. In such embodiments, the precursor gas comprising nitrogen and oxygen may be reacted with one or more of plasma activated Ar, He, and $H_2$. In an embodiment, the carbon containing precursor gas may comprises nitrogen or oxygen, and the precursor gas may be reacted with one or more of plasma activated $O_2$, $N_2$, and $NH_3$, in combination with one or more of plasma activated Ar, He, and $H_2$.

Figure 11:
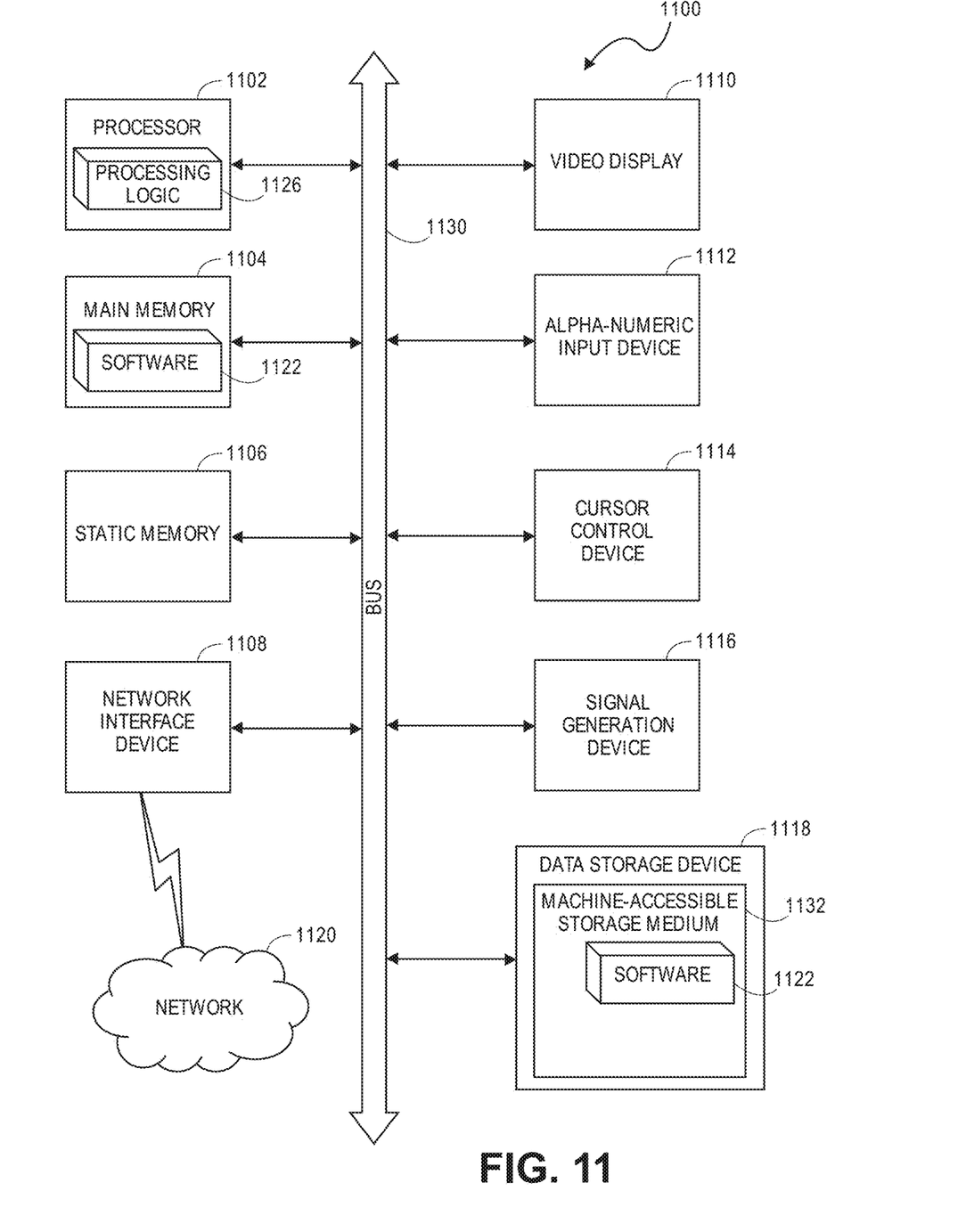
FIG. 11 illustrates a block diagram of an exemplary computer system that may be used to control a process for forming a flowable carbon film, in accordance with an embodiment.

Referring now to FIG. 11, a block diagram of an exemplary computer system 1160 of a processing tool is illustrated in accordance with an embodiment. In an embodiment, computer system 1160 is coupled to and controls processing in the processing tool. Computer system 1160 may be connected (e.g., networked) to other machines in a Local Area Network (LAN), an intranet, an extranet, or the Internet. Computer system 1160 may operate in the capacity of a server or a client machine in a client-server network environment, or as a peer machine in a peer-to-peer (or distributed) network environment. Computer system 1160 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 1160, the term "machine" shall also be taken to include any collection of machines (e.g., computers) that individually or jointly execute a set (or multiple sets) of instructions to perform any one or more of the methodologies described herein.

Computer system 1160 may include a computer program product, or software 1122, having a non-transitory machine-readable medium having stored thereon instructions, which may be used to program computer system 1160 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 1160 includes a system processor 1102, a main memory 1104 (e.g., read-only memory (ROM), flash memory, dynamic random access memory (DRAM) such as synchronous DRAM (SDRAM) or Rambus DRAM (RDRAM), etc.), a static memory 1106 (e.g., flash memory, static random access memory (SRAM), etc.), and a secondary memory 1118 (e.g., a data storage device), which communicate with each other via a bus 1130.

System processor 1102 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 1102 may also be one or more special-purpose processing devices such as an application specific integrated circuit (ASIC), a field programmable gate array (FPGA), a digital signal system processor (DSP), network system processor, or the like. System processor 1102 is configured to execute the processing logic 1126 for performing the operations described herein.

The computer system 1160 may further include a system network interface device 1108 for communicating with other devices or machines. The computer system 1160 may also include a video display unit 1110 (e.g., a liquid crystal display (LCD), a light emitting diode display (LED), or a cathode ray tube (CRT)), an alphanumeric input device 1112 (e.g., a keyboard), a cursor control device 1114 (e.g., a mouse), and a signal generation device 1116 (e.g., a speaker).

The secondary memory 1118 may include a machine-accessible storage medium 1131 (or more specifically a computer-readable storage medium) on which is stored one or more sets of instructions (e.g., software 1122) embodying any one or more of the methodologies or functions described herein. The software 1122 may also reside, completely or at least partially, within the main memory 1104 and/or within the system processor 1102 during execution thereof by the computer system 1160, the main memory 1104 and the system processor 1102 also constituting machine-readable storage media. The software 1122 may further be transmitted or received over a network 1120 via the system network interface device 1108.

While the machine-accessible storage medium 1131 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. A method for forming a carbon containing film, comprising:
    flowing a precursor gas into a processing chamber, wherein the precursor gas comprises carbon containing molecules;
    flowing a co-reactant gas into the processing chamber, wherein the precursor gas and the co-reactant gas are flown into the processing chamber in alternating pulses;
    striking a plasma in the processing chamber, wherein plasma activated co-reactant molecules initiate polymerization of the carbon containing molecules in the precursor gas; and
    depositing a carbon containing film onto a substrate in the processing chamber.

2. The method of claim 1, further comprising:
    curing the carbon containing film.

3. The method of claim 2, wherein curing comprises a UV cure.

4. The method of claim 2, wherein curing comprises annealing the carbon containing film.

5. The method of claim 1, wherein the plasma is a microwave plasma.

6. The method of claim 1, wherein the plasma is a capacitively coupled plasma (CCP).

7. The method of claim 1, wherein the plasma is a remote plasma source (RPS) plasma.

8. The method of claim 1, wherein the carbon containing molecules of the precursor comprises a vinyl group.

9. The method of claim 1, wherein the carbon containing molecules of the precursor comprises an alkyne group.

10. The method of claim 1, wherein the carbon containing molecules of the precursor gas comprises a nitrile group.

11. The method of claim 1, wherein the co-reactant gas comprises one or more of Ar, He, $N_2$, $H_2$, and $NH_3$.

12. A method for forming a carbon and nitrogen containing film, comprising:
    flowing a precursor gas into a processing chamber, wherein the precursor gas comprises carbon containing molecules;
    flowing a co-reactant gas into the processing chamber, wherein one or both of the carbon containing molecules of the precursor gas and the co-reactant gas comprise nitrogen, wherein the precursor gas and the co-reactant gas are flown into the processing chamber in alternating pulses;
    striking a plasma in the processing chamber, wherein plasma activated co-reactant molecules initiate polymerization of carbon containing molecules in the precursor gas; and
    depositing a carbon and nitrogen containing film onto a substrate in the processing chamber.

13. The method of claim 12, wherein the carbon containing molecules of the precursor gas comprises nitrogen, and wherein the co-reactant gas comprises one or more of Ar, He, and $H_2$.

14. The method of claim 12, wherein the carbon containing molecules of the precursor does not contain nitrogen, and wherein the co-reactant comprises one or both of $N_2$ and $NH_3$.

15. The method of claim 12, wherein the carbon containing molecules of the precursor comprises one or more of a vinyl group, an alkyne group, and a nitrile group.

16. The method of claim 12, wherein the plasma is a microwave plasma.

17. A method for forming a carbon-nitrogen-oxygen film, comprising:
- flowing a precursor gas into a processing chamber, wherein the precursor gas comprises carbon containing molecules;
- flowing a co-reactant gas into the processing chamber, wherein one or both of the carbon containing molecules of the precursor gas and the co-reactant gas comprise nitrogen and oxygen, wherein the precursor gas and the co-reactant gas are flown into the processing chamber in alternating pulses;
- striking a plasma in the processing chamber, wherein plasma activated co-reactant molecules initiate polymerization of the carbon containing molecules in the precursor gas; and
- depositing a carbon-nitrogen-oxygen film onto a substrate in the processing chamber.

18. The method of claim 17, wherein the co-reactant gas comprises $O_2$ and one or both of $N_2$ and $NH_3$, and wherein the co-reactant gas further comprises one or more of Ar, He, and $H_2$.

19. The method of claim 17, wherein the carbon containing molecules of the precursor gas comprises one or both of nitrogen and oxygen, and wherein the co-reactant gas comprises one or more of Ar, He, $H_2$, $N_2$ and $NH_3$.

20. The method of claim 17, wherein the plasma is a microwave plasma.

* * * * *